United States Patent
Son

(10) Patent No.: US 6,961,282 B2
(45) Date of Patent: Nov. 1, 2005

(54) SEMICONDUCTOR MEMORY DEVICE WITH DRIVING CIRCUITS FOR SCREENING DEFECTIVE WORDLINES AND RELATED METHODS

(75) Inventor: Tae-Sik Son, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 49 days.

(21) Appl. No.: 10/771,930

(22) Filed: Feb. 4, 2004

(65) Prior Publication Data

US 2004/0160850 A1 Aug. 19, 2004

(30) Foreign Application Priority Data

Feb. 14, 2003 (KR) .............................. 10-2003-0009503

(51) Int. Cl.$^7$ ................................................. G11C 8/00
(52) U.S. Cl. ................... 365/230.06; 365/222; 365/194
(58) Field of Search ........................... 365/230.06, 222, 365/194, 189.12, 200, 201

(56) References Cited

U.S. PATENT DOCUMENTS 6,449,204 B1 * 9/2002 Arimoto et al. ............ 365/222

* cited by examiner

*Primary Examiner*—David Lam
(74) *Attorney, Agent, or Firm*—Myers Bigel Sibley & Sajovec

(57) ABSTRACT

Methods for driving a wordline in a semiconductor memory device are provided. Pursuant to these methods, a wordline drive signal is generated that may be used to activate a first wordline in response to a drive signal that is derived from a row address signal. A wordline reset signal for deactivating the first wordline may then be generated in response to the drive signal derived from the row address signal, a refresh wordline signal established during a refresh operation, and a mode register set wordline signal provided from a mode register. Semiconductor memory devices that implement these methods are also disclosed.

23 Claims, 7 Drawing Sheets

SEMICONDUCTOR MEMORY DEVICE WITH DRIVING CIRCUITS FOR SCREENING DEFECTIVE WORDLINES AND RELATED METHODS

This application claims priority under 35 U.S.C. § 119 from Korean Patent Application No. 2003-9503, filed on Feb. 14, 2003, the contents of which are herein incorporated by reference in their entirety.

FIELD OF THE INVENTION

The present invention generally relates to semiconductor memory devices and, more particularly, to circuits for driving wordlines in semiconductor memory devices.

BACKGROUND OF THE INVENTION

In order to facilitate reducing the size and/or power requirements of portable electronic devices such as mobile telephones, personal data assistants and the like, efforts are ongoing to reduce the power consumption of semiconductor memory devices that may be used in such portable electronic devices. One way of reducing the power consumption in dynamic random access memory (DRAM) devices or pseudo SRAMs (also referred to as UTRAMs) is to reduce the amount of current flowing in the device. The overall power consumption of a semiconductor memory device includes both the power dissipated by currents used in the normal operation of the device as well as the power that is dissipated due to leakage currents that result from circuit defects. The leakage currents that may exist in conventional semiconductor memory devices include leakage currents that result from bridges between wordlines and bitlines. Such leakage currents may tend to increase with increasing integration density.

It is known in the art to use redundancy techniques in semiconductor memory devices such as DRAM and UTRAM devices in which spare memory cells are substituted for memory cells that are identified as being permanently defective cells for some reason such as, for example, a determination that the cell has a bridge that is resulting in leakage current. These redundancy techniques may facilitate maintaining a fully operable memory device. However, these redundancy techniques may not shut off the leakage currents that may be generated due to, for example, bridges between bitlines and wordlines.

FIG. 1 shows a core circuit of a memory cell array of a DRAM or UTRAM memory device. The circuit includes a wordline driver circuit 110. As shown in FIG. 1, the wordline driver circuit 110 may be used to activate a selected wordline (e.g., WL0 in FIG. 1) with a boosting voltage VPP in response to a wordline enable signal NWEi, a wordline drive signal PXiD, and a wordline reset signal PXiB. The wordline drive signal PXiD and the wordline reset signal PXiB may be generated from the wordline driver circuit 200 shown in FIG. 2 in response to a main wordline drive signal PXi that is set from a row address signal. The wordline drive signal PXiD actively charges the selected wordline WL0 up to the boosting voltage level VPP, while the wordline reset signal PXiB forces the wordline WL0 to be set to a ground voltage (or other reference voltage) when the wordline is deselected.

A memory cell array block 100 including a plurality of memory cells (exemplary cells 101, 102 are depicted in FIG. 1) may be arranged in rows and columns to form a matrix. The memory cell array block 100 is connected to a bitline equalizer 120 and a bitline sense amplifier (S/A) 130. The bitline equalizer 120 charges a pair of bitlines BL and BLB to a bitline precharge voltage VBL that may, for example, be equal to half of the power supply voltage VDD. The bitline sense amplifier 130 detects and outputs the voltage level of the data stored in a selected memory cell.

A bridge 140 may be formed between the wordline WL0 and the bitline BLB. If this occurs, when the wordline WL0 is not selected, a leakage current path ICC may be formed from the bitline precharge voltage VBL to the reference or ground voltage VSS. As shown in FIG. 1, this leakage current may flow through an equalizing transistor 122, the bitline BLB, the bridge 140, the wordline WL0, and a reset transistor 112 during a refresh operation (and, particularly when the device operates in a self-refresh mode).

FIG. 3 is a timing diagram illustrating operations for driving the wordlines in the semiconductor memory devices of FIGS. 1 and 2 during a self-refresh mode. As shown in FIG. 3, a self-refresh signal PR is set to a high level in response to the rising edge of the first cycle of an address signal that is generated from an internal counter in the self-refresh mode. The activated self-refresh signal PR activates both the main drive signal PXi and the wordline enable signal NWEi to a high level and sets the equalizing signal PEQ to a low level. The activation of the main drive signal PXi activates the wordline drive signal PXiD to a high level and sets the wordline reset signal PXiB to a low level. As shown in FIG. 3, when the counted address signal returns to a low level, the signals PR, PXi, NWEi, PEQ, PXiD, and PXiB are set to a low level, a low level, a low level, a high level, a low level, and a high level, respectively.

As shown in FIG. 1, the transistor 112 is turned on when the wordline reset signal PXiB is set to a high level and the transistor 122 is turned on when the equalizing signal PEQ is set to a high level. The leakage current path ICC from the bitline precharge voltage VBL to the ground voltage VSS travels through the transistor 122, the bitline BLB, the bridge 140, the wordline WL0, and the transistor 112.

The leakage current may flow through cells having a defective bridge structure during the self-refresh mode and/ or in a standby mode unless the power supply is shut off. The impact of the leakage current may be more serious in memory chips that are embedded in portable electronic devices because such devices typically have a limited battery life which is further shortened by the leakage currents.

SUMMARY OF THE INVENTION

Pursuant to embodiments of the present invention, methods for driving a wordline in a semiconductor memory device having a mode register are provided. Pursuant to these methods, a wordline drive signal is generated that may be used to activate a first wordline in response to a drive signal that is derived from a row address signal. A wordline reset signal for deactivating the first wordline may then be generated in response to the drive signal derived from the row address signal, a refresh wordline signal established during a refresh operation, and a mode register set wordline signal provided from the mode register.

In these methods, a delayed version of a master refresh signal may also be generated, and the refresh wordline signal may be generated in response to the delayed master refresh signal. The methods may also include generating an oscillation signal in response to the master refresh signal, generating a pulsed refresh signal from the oscillation signal, generating a refresh start signal in response to the pulsed refresh signal and the delayed refresh master signal, and/or generating the refresh wordline signal in response to both the delayed refresh master signal and the refresh start signal. In embodiments of the invention where a pulsed refresh signal is used, the pulsed refresh signal may be generated by converting the oscillation signal into a frequency-demultiplied signal and generating the pulsed refresh signal from the frequency-demultiplied signal. Furthermore, the mode register set wordline signal may be used to screen for defective wordlines in the semiconductor memory device.

Pursuant to further embodiments of the present invention, semiconductor memory devices are provided which include a mode register, a memory cell that is coupled to a wordline and a bitline, and a wordline driver for activating the wordline to access data stored in the memory cell in response to a wordline drive signal, a wordline reset signal. The wordline driver may include a transistor which connects the wordline to a ground voltage in response to the wordline reset signal. The device may further include a wordline enable signal and a wordline drive controller that is configured to generate the wordline drive signal and the wordline reset signal in response to a main drive signal, a refresh wordline signal established during a refresh operation, and a mode register set wordline signal provided from the mode register. The refresh wordline signal may control activation of the wordline reset signal during the refresh operation of the device. The main drive signal may be derived from a row address signal.

These devices may also include a refresh wordline controller that generates the refresh wordline signal in response to a master refresh signal. In embodiments of the present invention, the refresh wordline controller may comprise a pulsed refresh signal generation circuit that is configured to generates a pulsed refresh signal from an oscillation signal, a refresh start signal generation circuit that is configured to generate a refresh start signal in response to the pulsed refresh signal and a delayed version of the master refresh signal and a circuit configured to generate the refresh wordline signal in response to the delayed master refresh signal and the refresh start signal.

The mode register set wordline signal may control activation of the wordline reset signal during a test operation of the device that screens the wordline to determine if the wordline is defective.

Pursuant to still further embodiments of the present invention, methods for reducing a leakage current that flows through a bridge between a wordline and a bitline in a semiconductor memory device are provided. Pursuant to these methods, the wordline may first be identified as a defective wordline and then, after this identification has occurred, the wordline may be deactivated during a refresh operation of the semiconductor memory device. Deactivation of the wordline during the refresh operation may be accomplished by turning off a transistor which connects the wordline to a reference voltage. This transistor, in turn, may be turned off by deactivating a wordline reset signal.

In these methods, the wordline reset signal may be set in response to a drive signal, a refresh wordline signal established during the refresh operation, and a mode register wordline signal provided from a mode register of the semiconductor device. The wordline may be identified as being defective by comparing a first data bit that was written in a normal mode of the device from the wordline to a second data bit that was written from the wordline in a test mode and identifying the wordline as defective if the first and second data bits differ.

DETAILED DESCRIPTION

Figure 1:
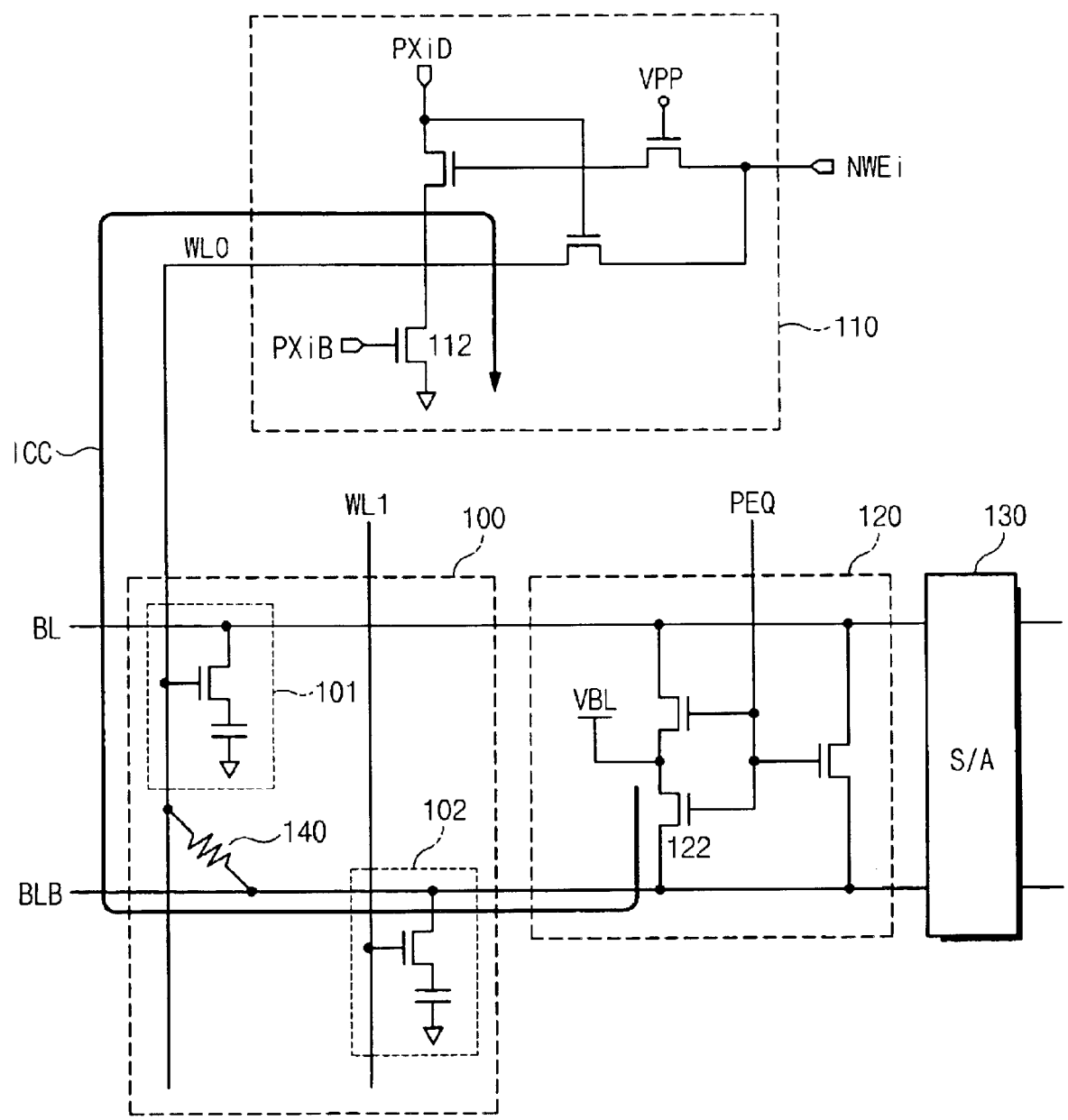
FIG. 1 is a circuit diagram of portions of conventional DRAM semiconductor memory device illustrating a leakage current path therein.
Figure 2:
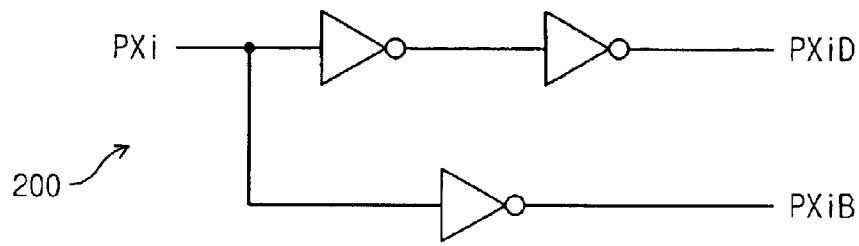
FIG. 2 is a circuit diagram of a conventional wordline drive controller.
Figure 3:
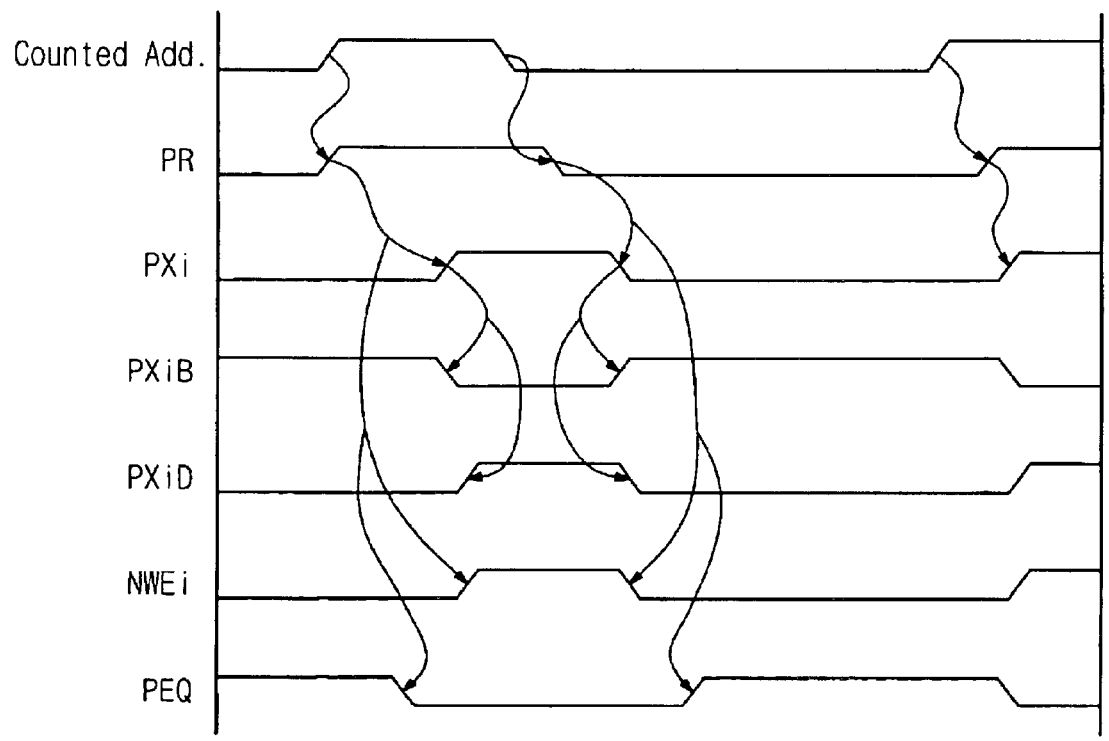
FIG. 3 is a timing diagram illustrating aspects of a self-refresh operation performed by the semiconductor memory device depicted in FIGS. 1 and 2.

The present invention will now be described more fully with reference to the accompanying drawings, in which examplary embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Moreover, each embodiment described and illustrated herein includes its complementary conductivity type embodiment as well. Like reference numerals refer to like elements throughout.

Figure 4:
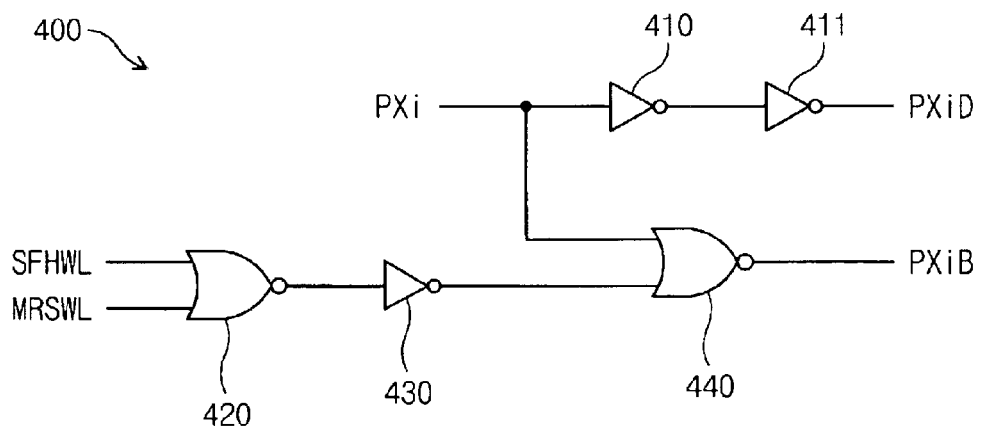
FIG. 4 is a circuit diagram of a wordline drive controller according to embodiments of the present invention.

FIG. 4 is a circuit diagram of a wordline drive controller 400 according to embodiments of the present invention. As shown in FIG. 4, the wordline drive controller 400 receives a main drive signal PXi, a mode register set (MRS) wordline signal MRSWL and a refresh wordline signal SFHWL. The wordline drive controller 400 generates the wordline drive signal PXiD and the wordline reset signal PXiB. The MRS wordline signal MRSWL and the refresh wordline signal SFHWL are applied to a NOR gate 420. The output of the NOR gate 420 is received as an input to a NOR gate 440 through an inverter 430. The NOR gate 440 receives as its second input the main drive signal PXi. The NOR gate 440 generates the wordline reset signal PXiB. The main drive signal PXi is converted into the wordline drive signal PXiD through inverters 410 and 411. The wordline drive controller 400 of FIG. 4 generates the wordline reset signal PxiB in response to the mode register set wordline signal MRSWL and the refresh wordline signal SFHWL. The refresh wordline signal SFHWL is a control signal that is used in a self-refresh operation mode of the semiconductor memory device.

Figure 5:
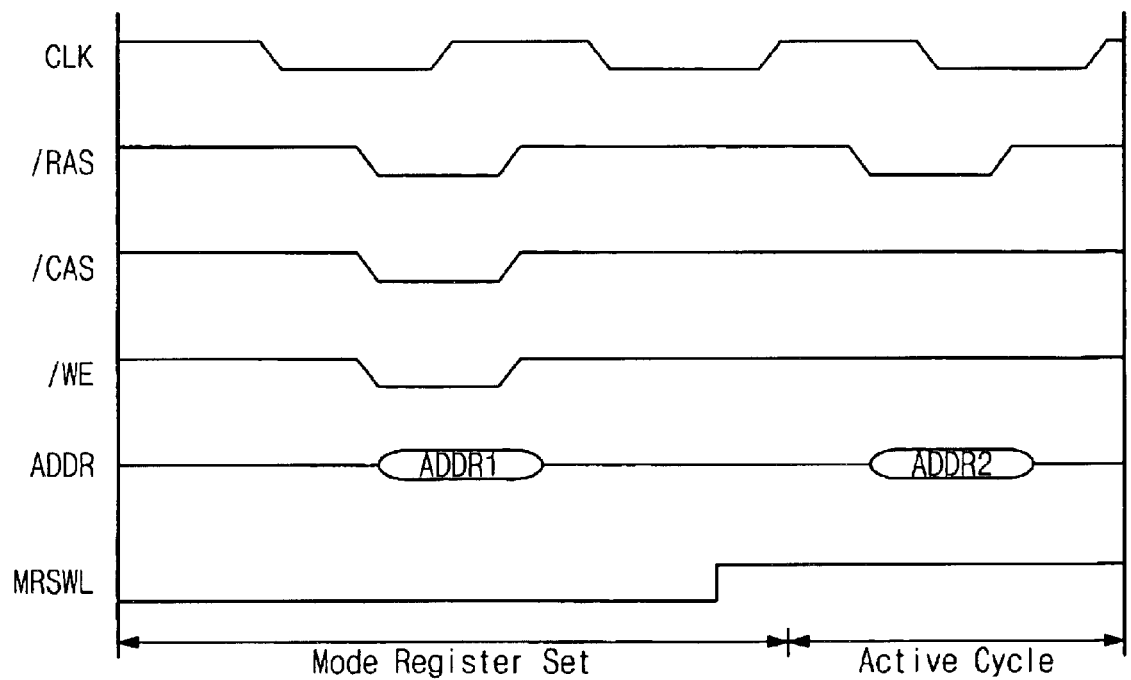
FIG. 5 is a timing diagram for generating a mode register set (MRS) wordline signal that may be used in conjunction with the wordline drive controller of FIG. 4.

The MRS wordline signal MRSWL may be provided from a mode register set circuit that is used to establish operation modes in the memory device (e.g., synchronous DRAM). The MRS wordline signal MRSWL may be generated in accordance with the timing pattern shown in FIG. 5. As shown in FIG. 5, during a low level of a clock signal CLK, a row address strobe signal /RAS, a column address strobe signal /CAS, and a write enable signal /WE are set to low levels and an address signal ADDR is introduced and stored in the mode register. The mode register is programmed to set various operation modes such as CAS latency, burst type, test mode, vender-specific options, and the like. In addition to setting operation modes, the mode register further generates the MRS wordline signal MRSWL in a test mode to identify any bitline-to-wordline bridges or wordline defects. The MRS wordline signal MRSWL may determine the memory device to be operable in a normal operation mode or a test operation mode after two clock cycles for the mode register set. In a normal operation mode, the MRS wordline signal MRSWL is set to a low level to hold inactive wordlines at the ground voltage, retaining data levels of memory cells coupled to the inactive wordlines which are not selected.

In a test mode, the MRS wordline signal MRSWL is set to a high level to reset the wordline reset signal PXiB to a low level. The setting of the wordline reset signal PXiB to a low level turns the NMOS transistor 112 of the wordline driver 110 (see FIG. 1) off to isolate the current path toward the ground voltage, by which a wordline involved in the wordline reset signal PXiB is floated. Next, a data bit previously written in the normal mode is compared to a current data bit of a memory cell coupled to the floating wordline. If the two data bits differ, it is assumed that there is a defect due to a wordline-to-bitline bridge or some other structural defect.

Figure 6:
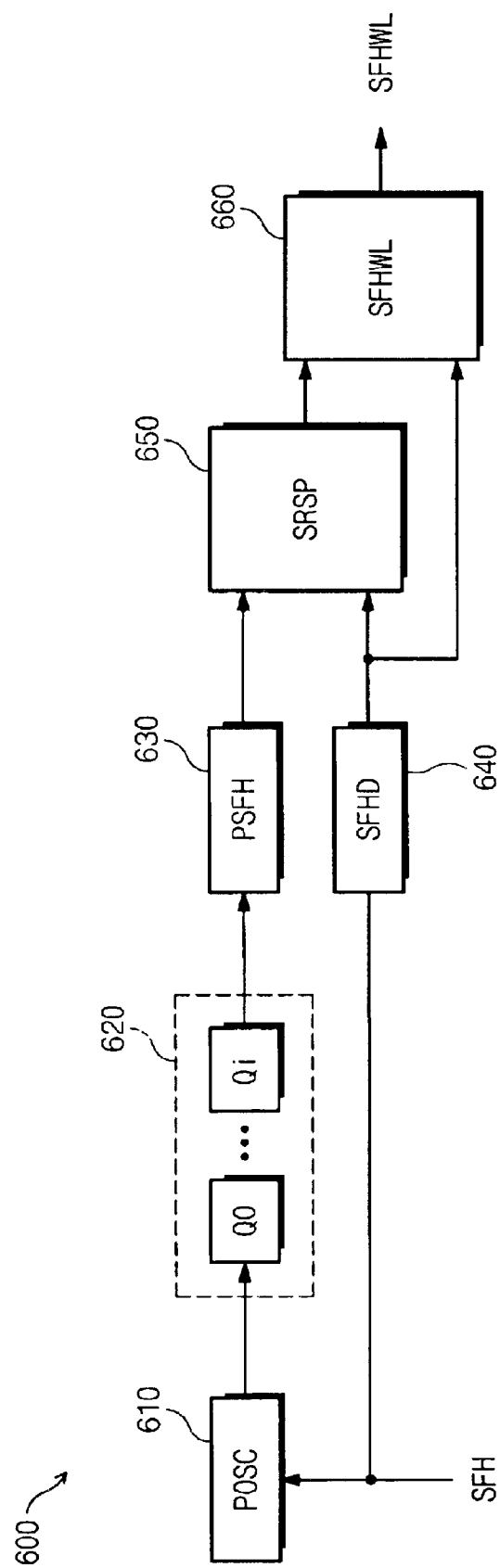
FIG. 6 is a block diagram of a refresh wordline controller according to embodiments of the present invention.

FIG. 6 is a block diagram illustrating the functional structure of a refresh wordline controller 600 according to embodiments of the present invention. As shown in FIG. 6, the refresh wordline controller 600 includes an oscillator 610, a frequency divider 620, an auto pulse generator 630, a delay circuit 640, a self-refresh start circuit 650 and a refresh wordline signal generator 660. The oscillator 610 generates an oscillation signal POSC in response to a self-refresh master signal SFH that is established by self-refresh information programmed into the mode register. The frequency divider 620 generates a frequency-demultiplied signal Qi from the oscillation signal POSC. The signal Qi may be established with a frequency that is, for example, ½, ¼ or ⅛th the frequency of the oscillation signal POSC.

The auto pulse generator 630 generates a self-refresh pulse signal PSFH that is set by restricting a cycle time of the frequency-demultiplied signal Qi in a predetermined period. Methods for generating such a pulse signal are well known to those of skill in the art. The delay circuit 640 delays the self-refresh master signal SFH for a predetermined time. The self-refresh start circuit 650 generates the self-refresh start signal SRSP in response to the delayed self-refresh master signal SFHD and the auto refresh pulse signal PSFH. The self-refresh start signal SRSP is active in accordance with the auto refresh pulse signal PSFH when the delayed self-refresh master signal SFHD is activated. The refresh wordline signal generator 660 outputs the refresh wordline signal SFHWL in response to the self-refresh start signal SRSP and the delayed self-refresh master signal SFHD.

Figure 7:
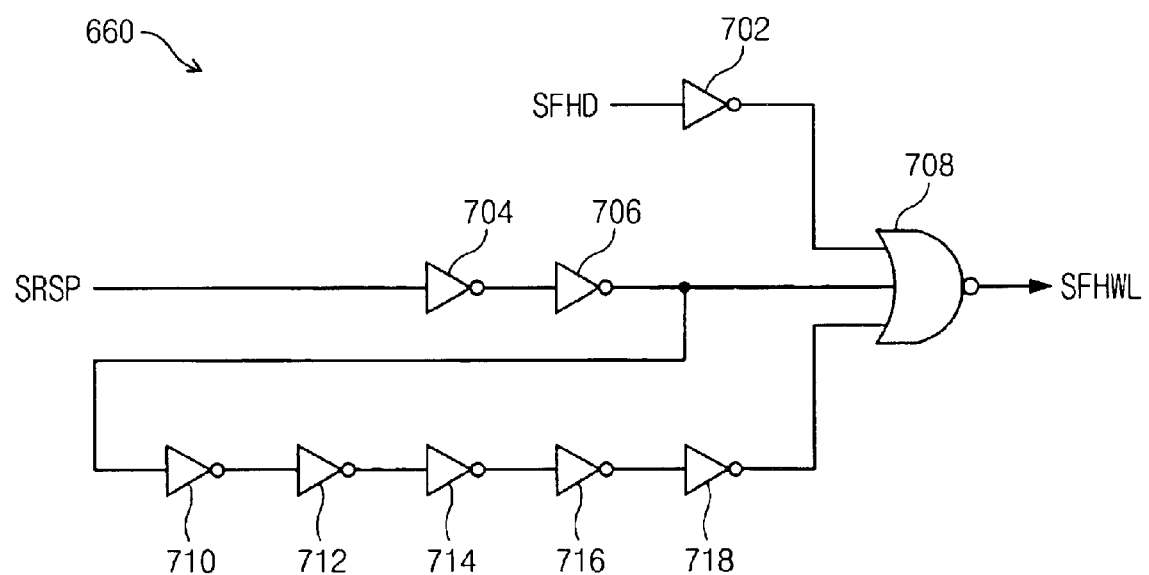
FIG. 7 is a circuit diagram of an embodiment of the refresh wordline signal generator of the refresh wordline controller shown in FIG. 6.

FIG. 7 is a circuit diagram of the refresh wordline signal generator 660 shown in FIG. 6. As shown in FIG. 7, the refresh wordline signal generator 660 includes a NOR gate 708 with three input terminals one of which receives the self-refresh start signal SRSP through inverters 704 and 706. The output of the inverter 706 is also connected to the second input terminal of the NOR gate 708 through a series of inverters 710, 712, 714, 716 and 718. The third input terminal of the NOR gate 708 is connected to the output of an inverter 702 that receives the delayed self-refresh master signal SFHD. The NOR gate 708 outputs the refresh wordline signal SFHWL.

Figure 8:
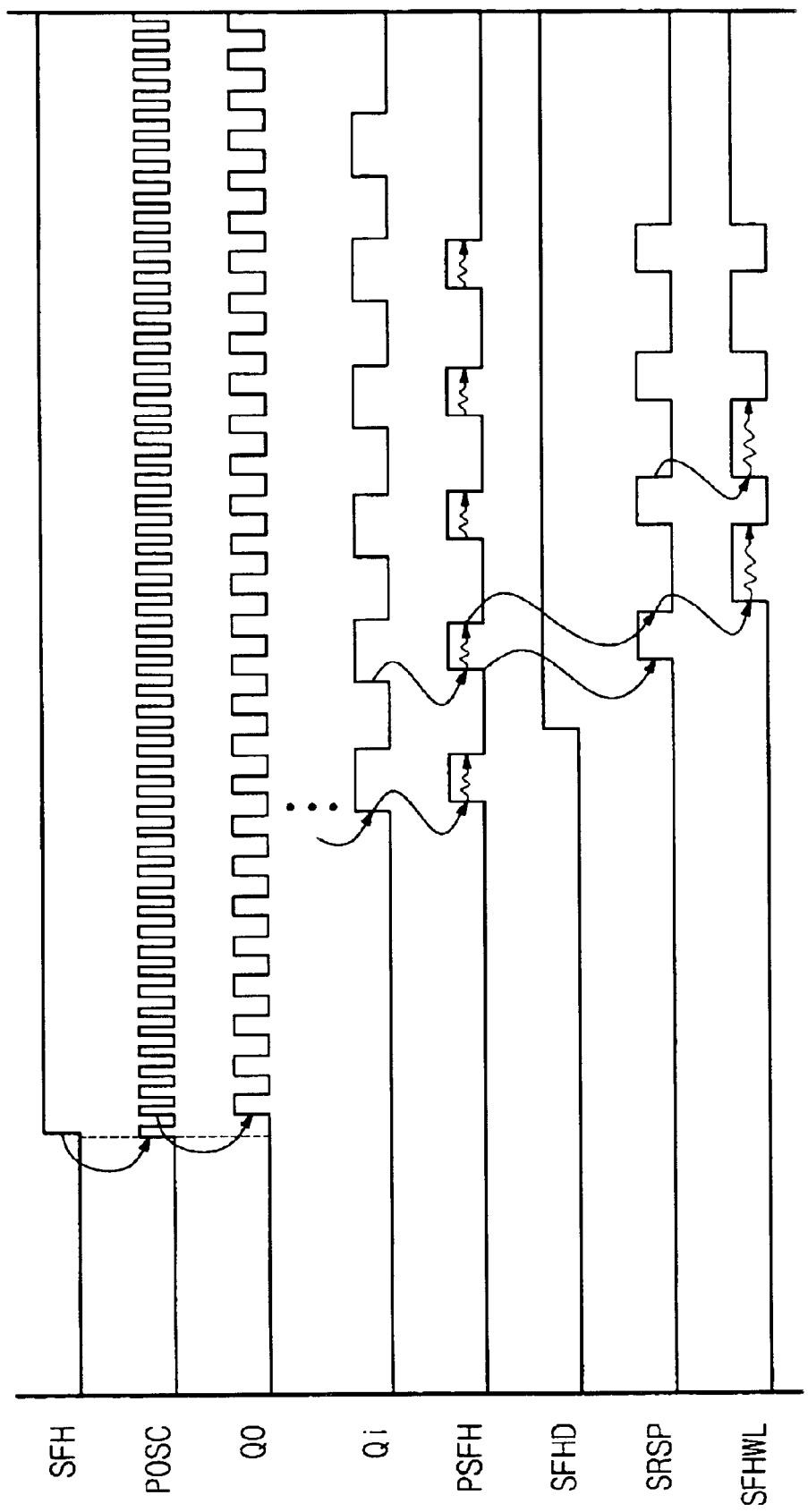
FIG. 8 is a timing diagram illustrating generation of the refresh wordline signal with reference to FIGS. 6 and 7.

FIG. 8 is a timing diagram illustrating an operational timing flow that may be used to generate the refresh wordline signal SFHWL according to embodiments of the present invention. As shown in FIG. 8, the self-refresh master signal SFH is set to a high level to generate the oscillation signal POSC. The self-refresh master signal SFH is converted into a twice demultiplied signal Q0. The signal Q0 may then be demultiplied one or more additional times until it reaches the signal Qi that is demultiplied from the original oscillation signal POSC by a predetermined number of times. The frequency-demultiplied signal Qi actuates generation of the self-refresh pulse signal PSFH by the auto pulse generator 630. Then, for an active high-level period of the delayed self-refresh master signal SFHD, the self-refresh start signal SRSP is generated in response to the pulse signal PSFH. The refresh wordline signal SFHWL is activated in response to the falling edges of the self-refresh start signal SRSP when the delayed self-refresh master signal SFHD is set to a high level. The refresh wordline signal SFHWL is a pulse signal. Each pulse of the signal may have the same width.

Figure 9:
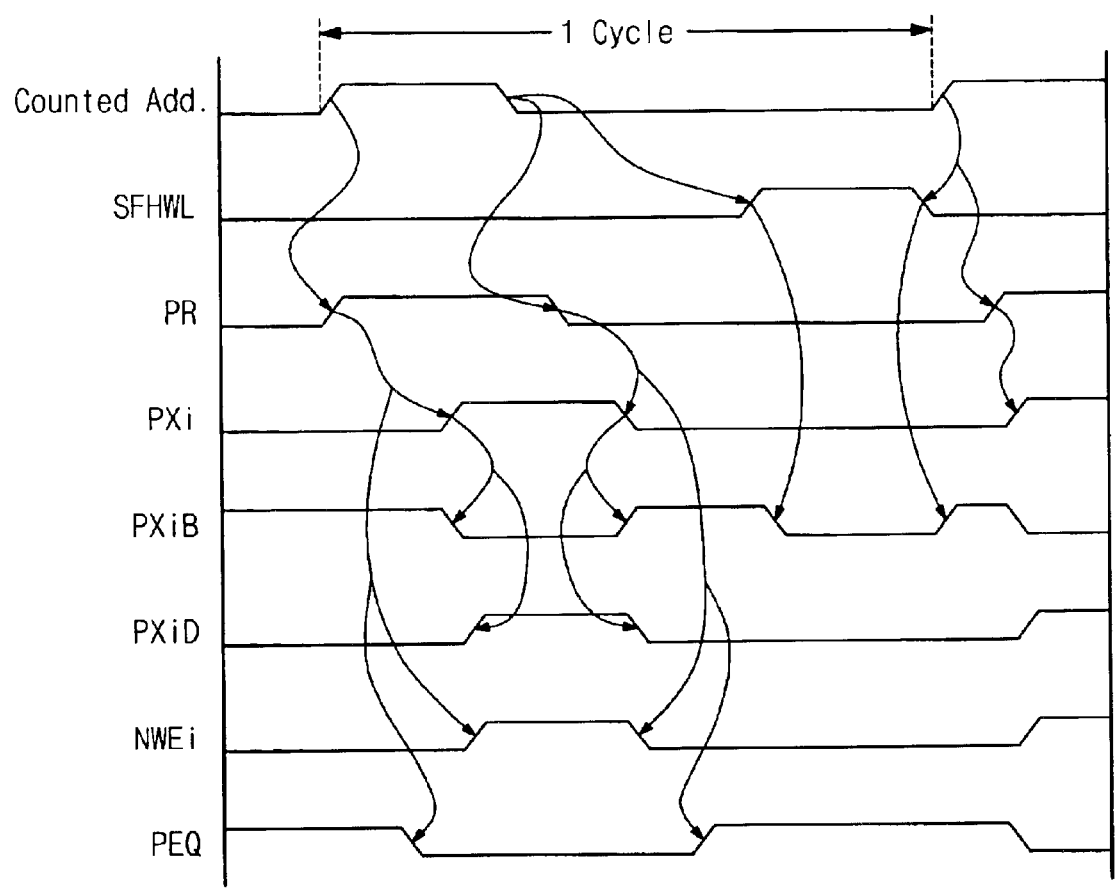
FIG. 9 is a timing diagram illustrating operations for driving a wordline according to embodiments of the present invention.

FIG. 9 illustrates activation of the refresh wordline signal SFHWL which may comprise an input to the wordline drive controller 400 of FIG. 4 and the wordline driver 110 of FIG. 1 in accordance with embodiments of the present invention. As shown in FIG. 9, during a self-refresh operation for a wordline in one clock cycle, if the refresh wordline signal SFHWL becomes active (i.e., is set to a high level), the wordline reset signal PXiB is set to a low level, thereby turning off the NMOS transistor 112 to prevent forming the current path ICC to the ground voltage.

Thus, pursuant to embodiments of the present invention, the undesirable current dissipation that may occur due to bridge defects between wordlines and bitlines during a refresh (or self-refresh) mode or a standby mode may be reduced. Moreover, pursuant to embodiments of the present invention, defective wordlines which cause abnormal current consumption can be identified by screening the wordlines with a signal that is easily set from a mode register.

Although exemplary embodiments of the present invention have been disclosed for illustrative purposes, those skilled in the art will appreciate that various modifications, additions and substitutions are possible, without departing from the scope and spirit of the invention as described in the accompanying claims. For instance, the refresh wordline signal may be applicable to a normal refresh operation mode as well as the self-refresh mode because they are similar each other but the way of address generation.

What is claimed is:

1. A method for driving a first wordline in a semiconductor memory device having a mode register, the method comprising:

generating a wordline drive signal for activating the first wordline in response to a drive signal; and generating a wordline reset signal for deactivating the first wordline in response to the drive signal, a refresh wordline signal established during a refresh operation, and a mode register set wordline signal provided from the mode register.

2. The method of claim 1, wherein the first wordline is one of a plurality of wordlines included in the semiconductor memory device, and wherein the mode register set wordline signal is used to screen for defective wordlines in the plurality of wordlines.

3. The method of claim 1, further comprising generating a delayed version of a master refresh signal, and wherein the refresh wordline signal is generated in response to the delayed master refresh signal.

4. The method of claim 3, further comprising:
generating an oscillation signal in response to the master refresh signal;
generating a pulsed refresh signal from the oscillation signal;
generating a refresh start signal in response to the pulsed refresh signal and the delayed refresh master signal; and
generating the refresh wordline signal in response to both the delayed refresh master signal and the refresh start signal.

5. The method of claim 4, wherein generating the pulsed refresh signal from the oscillation signal comprises converting the oscillation signal into a frequency-demultiplied signal and generating the pulsed refresh signal from the frequency-demultiplied signal.

6. A semiconductor memory device comprising:
a wordline;
a bitline;
a memory cell coupled to the wordline and the bitline;
a mode register;
a wordline driver for activating the wordline to access data stored in the memory cell in response to a wordline drive signal, a wordline reset signal, and a wordline enable signal; and
a wordline drive controller configured to generate the wordline drive signal and the wordline reset signal in response to a main drive signal, a refresh wordline signal established during a refresh operation, and a mode register set wordline signal provided from the mode register.

7. The semiconductor memory device of claim 6, further comprising a refresh wordline controller that generates the refresh wordline signal in response to a master refresh signal.

8. The semiconductor memory device of claim 7, wherein the refresh wordline controller comprises:
a pulsed refresh signal generation circuit that is configured to generates a pulsed refresh signal from an oscillation signal;
a refresh start signal generation circuit that is configured to generate a refresh start signal in response to the pulsed refresh signal and a delayed version of the master refresh signal; and
a circuit configured to generate the refresh wordline signal in response to the delayed master refresh signal and the refresh start signal.

9. The semiconductor memory device of claim 8, wherein the circuit configured to generate the refresh wordline signal in response to the delayed master refresh signal and the refresh start signal performs a logical NOR operation on at least the inverse of the self refresh master signal and the self refresh start signal.

10. The semiconductor memory device of claim 6, wherein the wordline driver includes a transistor which connects the wordline to a ground voltage in response to the wordline reset signal.

11. The semiconductor memory device of claim 10, wherein the refresh wordline signal controls activation of the wordline reset signal during the refresh operation of the device.

12. The semiconductor memory device of claim 10, wherein the mode register set wordline signal controls activation of the wordline reset signal during a test operation of the device that screens the wordline to determine if the wordline is defective.

13. The semiconductor memory device of claim 6, wherein the main drive signal is derived from a row address signal.

14. The semiconductor memory device of claim 6, wherein the wordline drive controller comprises a circuit that generates the wordline reset signal as a logical NOR operation of the drive signal and a second signal that comprises the output of a logical OR operation of the refresh wordline signal and the mode register set wordline signal.

15. A method for reducing a leakage current that flows through a bridge between a wordline and a bitline in a semiconductor memory device, the method comprising:
activating the wordline during a first interval of a refresh operation of the semiconductor memory device;
deactivating the wordline during a second interval of the refresh operation; and
floating the wordline during a third interval of the refresh operation.

16. The method of claim 15, wherein floating the wordline during the third interval of the refresh operation comprises turning off a transistor which connects the wordline to a reference voltage.

17. The method of claim 16, wherein turning off a transistor comprises deactivating a wordline reset signal.

18. The method of claim 16, wherein the wordline reset signal is set in response to a drive signal, a refresh wordline signal established during the refresh operation, and a mode register wordline signal provided from a mode register of the semiconductor device.

19. The method of claim 18, wherein the wordline reset signal is set by performing a logical NOR operation on the drive signal and an output signal generated by performing a logical OR operation on the refresh wordline signal and the mode register set wordline signal.

20. The method of claim 18, further comprising generating a delayed version of a master refresh signal, and wherein the refresh wordline signal is generated in response to the delayed master refresh signal.

21. The method of claim 20, further comprising:
generating an oscillation signal in response to the master refresh signal;
generating a pulsed refresh signal from the oscillation signal;
generating a refresh start signal in response to the pulsed pulses signal and the delayed refresh master signal; and
generating the refresh wordline signal in response to both the delayed refresh master signal and the refresh start signal.

22. The method of claim 21, wherein generating the pulsed refresh signal from the oscillation signal comprises converting the oscillation signal into a frequency-demultiplied signal and generating the pulsed refresh signal from the frequency-demultiplied signal.

23. The method of claim 15, further comprising comparing a first data bit that was written in a normal mode of the device from the wordline to a second data bit that was written from the wordline in a test mode and identifying the wordline as defective if the first and second data bits differ.

* * * * *